(12) United States Patent
Berge et al.

(10) Patent No.: US 11,300,605 B2
(45) Date of Patent: Apr. 12, 2022

(54) PRINTED CIRCUIT BOARD PERFORMANCE EVALUATION TECHNIQUES

(71) Applicant: International Business Machines Corporation, Armonk, NY (US)

(72) Inventors: Layne A. Berge, Rochester, MN (US); Matthew S. Doyle, Chatfield, MN (US); Manuel Orozco, Rochester, MN (US); John R. Dangler, Rochester, MN (US); Thomas W. Liang, Rochester, MN (US); Jason J. Bjorgaard, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 777 days.

(21) Appl. No.: 15/986,521

(22) Filed: May 22, 2018

(65) Prior Publication Data
US 2019/0361069 A1 Nov. 28, 2019

(51) Int. Cl.
*G01R 31/28* (2006.01)
*H05K 1/18* (2006.01)
(Continued)

(52) U.S. Cl.
CPC ..... *G01R 31/2818* (2013.01); *G01R 31/2813* (2013.01); *H05K 1/0268* (2013.01); *H05K 1/165* (2013.01); *H05K 1/181* (2013.01)

(58) Field of Classification Search
CPC ............ G01R 21/2818; G01R 31/2818; G01R 31/2813
See application file for complete search history.

(56) References Cited

U.S. PATENT DOCUMENTS

| 4,491,819 A | 1/1985 | Ray |
| 5,784,782 A | 7/1998 | Boyko et al. |

(Continued)

FOREIGN PATENT DOCUMENTS

CN 103943928 A 7/2014

OTHER PUBLICATIONS

Day et al., *Method for Fabricating Imaged Sticker Sheet for use in Printed Circuit Cards/Boards*, IBM, An IP.com Prior Art Database Technical Disclosure, Original Publication Date: Dec. 1, 1990, IP.com No. IPCOM000103484D, IP.com Electronic Publication Date: Mar. 18, 2005, 2 pages.
(Continued)

*Primary Examiner* — Livius R. Cazan
(74) *Attorney, Agent, or Firm* — Nathan M. Ran

(57) ABSTRACT

The present disclosure describes printed circuit board performance evaluation techniques. In some cases, a printed circuit board performance evaluation process may include determining a first set of electrical properties associated with an interface between components of a printed circuit board, where the interface is disposed on an internal or external layer of the printed circuit board. After selective application of a sheet of dielectric material to a portion of a transmission line in the interface, a second set of electrical properties associated with the interface may be determined. The first set of electrical properties may be compared to the second set of electrical properties to evaluate printed circuit board performance. In other cases, the interface may include a trace inductor, and electrical properties of the interface before and after application of a ferrous material may be compared to evaluate printed circuit board performance.

7 Claims, 8 Drawing Sheets

(51) Int. Cl.
*H05K 1/02* (2006.01)
*H05K 1/16* (2006.01)

(56) References Cited

U.S. PATENT DOCUMENTS

| | | |
|---|---|---|
| 6,518,766 B2* | 2/2003 | Sudo .................. G01R 31/2812 |
| | | 324/519 |
| 6,995,322 B2 | 2/2006 | Chan et al. |
| 7,079,373 B2 | 7/2006 | Dunn et al. |
| 7,247,590 B2 | 7/2007 | Kawabata et al. |
| 8,589,102 B2 | 11/2013 | Chainer et al. |
| 2019/0208619 A1* | 7/2019 | Zhang ..................... H05K 3/46 |

OTHER PUBLICATIONS

McDonald et al., *Magnetically biased inductor for an aerospace switched reluctance drive,* Conference: 2015 IEEE International Electric Machines & Drives Conference (IEMDC), DOI: 10.1109/IEMDC.2015.7409225, Conference Paper dated May 2015, 7 pages.

* cited by examiner

PRINTED CIRCUIT BOARD PERFORMANCE EVALUATION TECHNIQUES

BACKGROUND

With any electronic design, there are typically multiple interfaces between components on a printed circuit board. As speeds increase, these interfaces become increasingly more difficult to design and manufacture. As such, more time is spent to simulate these interfaces in order to decrease the design cycle time and to decrease costs associated with creating multiple revisions in real hardware. Simulation may reduce test time and may allow a product to be successfully tested in the lab and sent to product test sooner.

In a simulation, not only a nominal case is considered. Many variables may be altered depending on the tolerances of the parts delivered from third party manufacturers as well as the physical manufacturing of the printed circuit board. It may be easy to account for these changes in a simulation, but in real hardware it may be difficult to account for all variables. For some parts, a designer may request that a manufacturer provide different parts associated with different process parameters. However, in the case of a printed circuit board, quality may differ as a result of many factors, such as the manufacturing location and the environmental conditions experienced during production, among other factors. Performing extensive tests on a single printed circuit board from a manufacturer may not guarantee that certain interfaces will perform adequately on thousands of products. Accordingly, there is a need for improved printed circuit board evaluation techniques.

SUMMARY

According to one embodiment, a process of printed circuit board performance evaluation includes determining a first set of electrical properties associated with an interface between components of a printed circuit board (PCB), where the interface is disposed on an external layer of the PCB. The process includes applying a sheet of dielectric material to the external layer of the PCB such that the sheet overlies a portion of a transmission line in the interface. The process also includes determining a second set of electrical properties associated with the interface after application of the sheet of dielectric material. The process further includes comparing the first set of electrical properties to the second set of electrical properties to evaluate printed circuit board performance.

According to another embodiment, a process of printed circuit board performance evaluation includes determining a first set of electrical properties associated with an interface between components of a PCB, where the interface is disposed on an internal layer of the PCB. The process includes forming a cavity to expose a portion of a transmission line disposed on the internal layer of the PCB. The process also includes applying a sheet of dielectric material to the exposed portion of the transmission line and determining a second set of electrical properties associated with the interface after application of the sheet of dielectric material. The process further includes comparing the first set of electrical properties to the second set of electrical properties to evaluate printed circuit board performance.

According to yet another embodiment, a process of printed circuit board performance evaluation includes determining a first set of electrical properties associated with an interface between components of a PCB, where the interface includes a trace inductor. The process also includes applying a sheet of ferrous material to the trace inductor and determining a second set of electrical properties associated with the interface after application of the sheet of ferrous material. The process further includes comparing the first set of electrical properties to the second set of electrical properties to evaluate printed circuit board performance.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes printed circuit board performance evaluation techniques. In the present disclosure, small sheets of materials (e.g., sheets of dielectric/ferrous materials) are utilized to alter the electrical characteristics of an interface of a printed circuit board. By utilizing such small sheets, a designer is able to affect the electrical properties of different interfaces. This enables the designer to test the robustness of the interface to varying process parameters that may be encountered during full-scale production of the product.

In some cases, dielectric sheets of varying size and permittivity may be selectively applied to an interface between components of a printed circuit board. The dielectric sheets are used to change the electrical properties of the interface beneath the sheet. The change in electrical properties is used to perform margin testing on the interface. In other cases, the interface may include a trace inductor, and a sheet of ferrous material may be used to modify trace inductance for printed circuit board performance evaluation.

In some embodiments of the present disclosure, a dielectric sheet may be used to alter the electrical properties of an interface disposed on an external layer of a printed circuit board (e.g., a microstrip). In this case, the dielectric sheet may be applied directly to the external layer in order to modify the electrical properties of the interface. In other embodiments of the present disclosure, the dielectric sheets may be used to alter the electrical properties of an interface disposed on an internal layer of a printed circuit board (e.g., a stripline). In this case, a cavity may be created to expose a portion of the interface, and the dielectric sheet may fill the cavity in order to alter the electrical properties of the interface.

Figure 1:
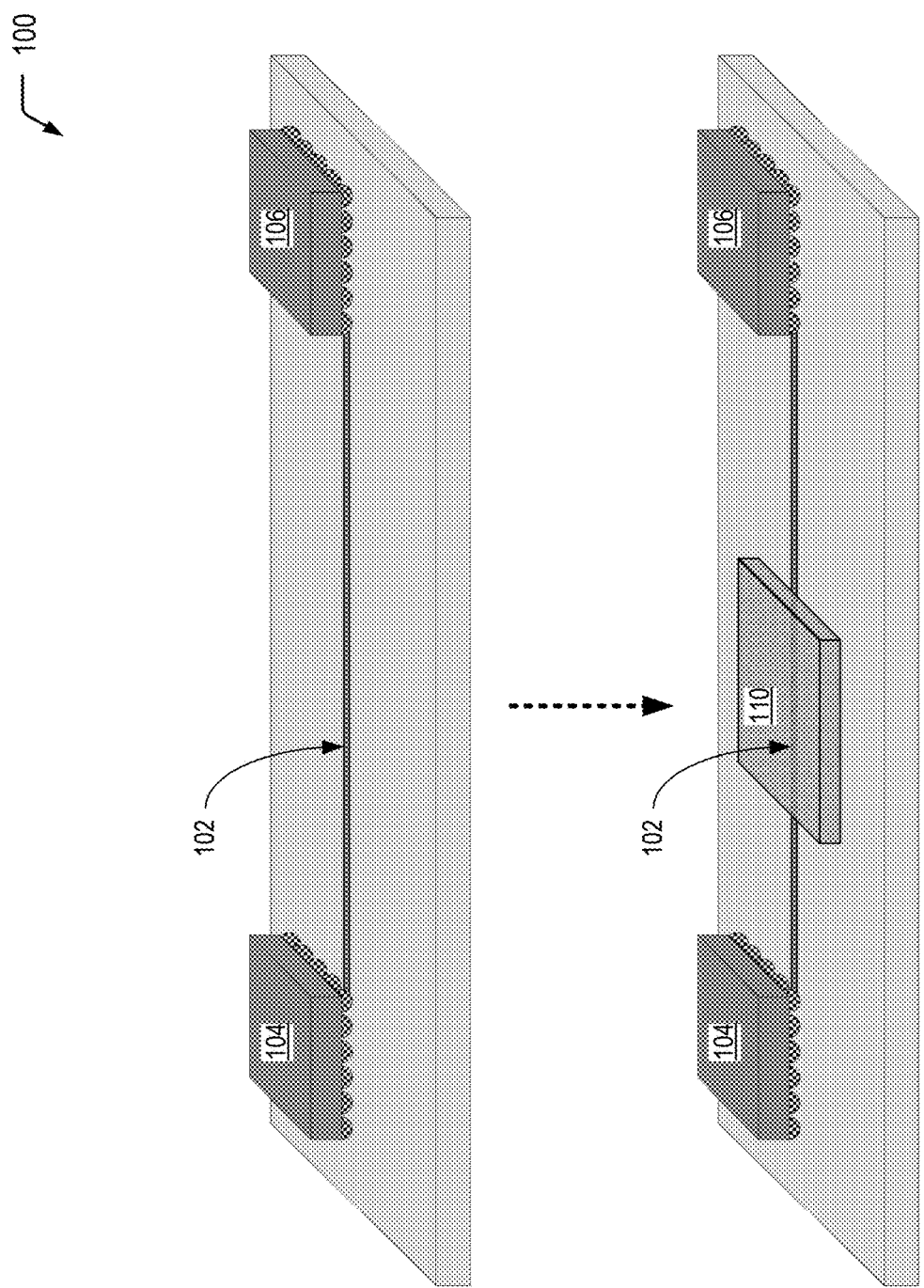
FIG. 1 is a diagram illustrating a process of selectively applying a sheet of dielectric material to a portion of a transmission line in an interface disposed on an external layer of a PCB for evaluation of electrical properties of the interface, according to one embodiment.

Referring to FIG. 1, a particular embodiment of a printed circuit board performance evaluation technique is illustrated and generally designated 100. In FIG. 1, a transmission line 102 electrically connects a first printed circuit board (PCB) component 104 and a second PCB component 106. The top portion of FIG. 1 illustrates the external layer of the PCB prior to application of a dielectric sheet 110. The bottom portion of FIG. 1 illustrates that the dielectric sheet 110 overlies a portion of the transmission line 102. In some cases, the external layer may include a solder mask that overlies the interface. In some cases, the transmission line 102 corresponds to an external microstrip trace.

The dielectric sheet 110 is used to change the electrical properties of the interface beneath the dielectric sheet 110. As illustrative, non-limiting examples, the dielectric sheet 110 may include a polytetrafluoroethylene (PTFE) sheet, a graphite sheet, a silicone sheet, a sapphire sheet, or a polyimide sheet, with differing permittivity values. The dielectric sheet 110 enables a designer to affect the electrical properties of different interfaces beneath the dielectric sheet 110. This enables the designer to test the robustness of the interface to varying process parameters that may be encountered during full-scale production of the product. For example, the interface may include a high-speed serial interface or a memory interface, among other alternatives. The size and/or permittivity of the dielectric sheet 110 may vary, and the change in electrical properties may be used to perform margin testing on the interface.

To illustrate, a process of printed circuit board performance evaluation may include determining a first set of electrical properties associated with the interface between the first PCB component 104 and the second PCB component 106 prior to application of the dielectric sheet 110. The dielectric sheet 110 has a size and a permittivity selected to emulate a particular set of PCB manufacturing process parameters within a range of PCB manufacturing process parameters. Application of the dielectric sheet 110 (having a particular size/permittivity) results in a change in the electrical properties of the interface. As such, the process of printed circuit board performance evaluation may also include determining a second set of electrical properties associated with the interface after application of the dielectric sheet 110. The process of printed circuit board performance evaluation may further include performing margin testing by comparing the first set of electrical properties to the second set of electrical properties to evaluate printed circuit board performance.

Thus, FIG. 1 illustrates an example of a printed circuit board performance evaluation technique that includes selective application of a dielectric sheet to a portion of a transmission line in an interface disposed on an external layer of the printed circuit board. Application of the dielectric sheet results in a change in the electrical properties of the underlying interface, and the resulting change may be used to evaluate printed circuit board performance.

Figure 2A:
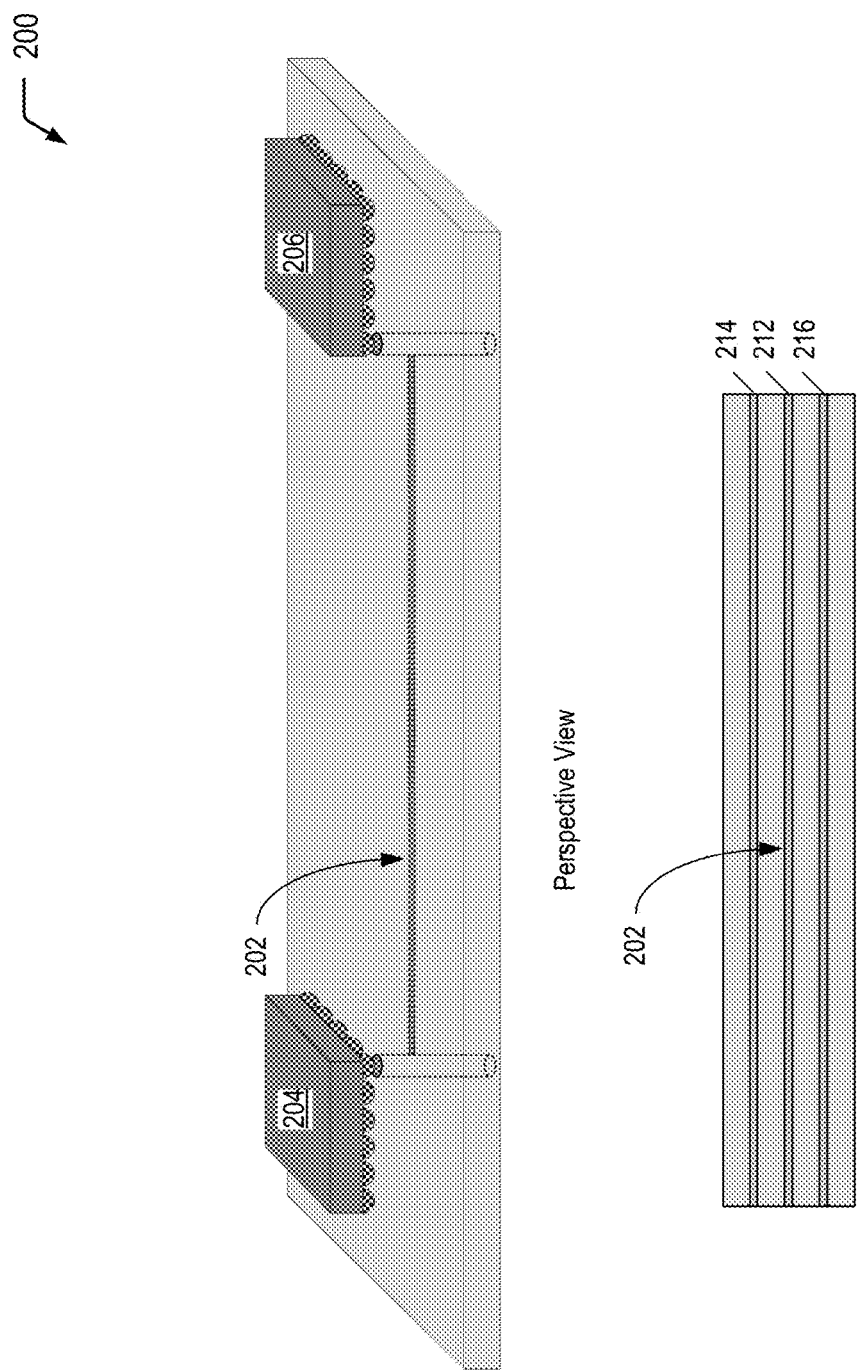
FIGS. 2A to 2C are diagrams illustrating a process of selectively applying a sheet of dielectric material to a portion of a transmission line in an interface disposed on an internal layer of a PCB for evaluation of electrical properties of the interface, according to one embodiment.
Figure 2B:
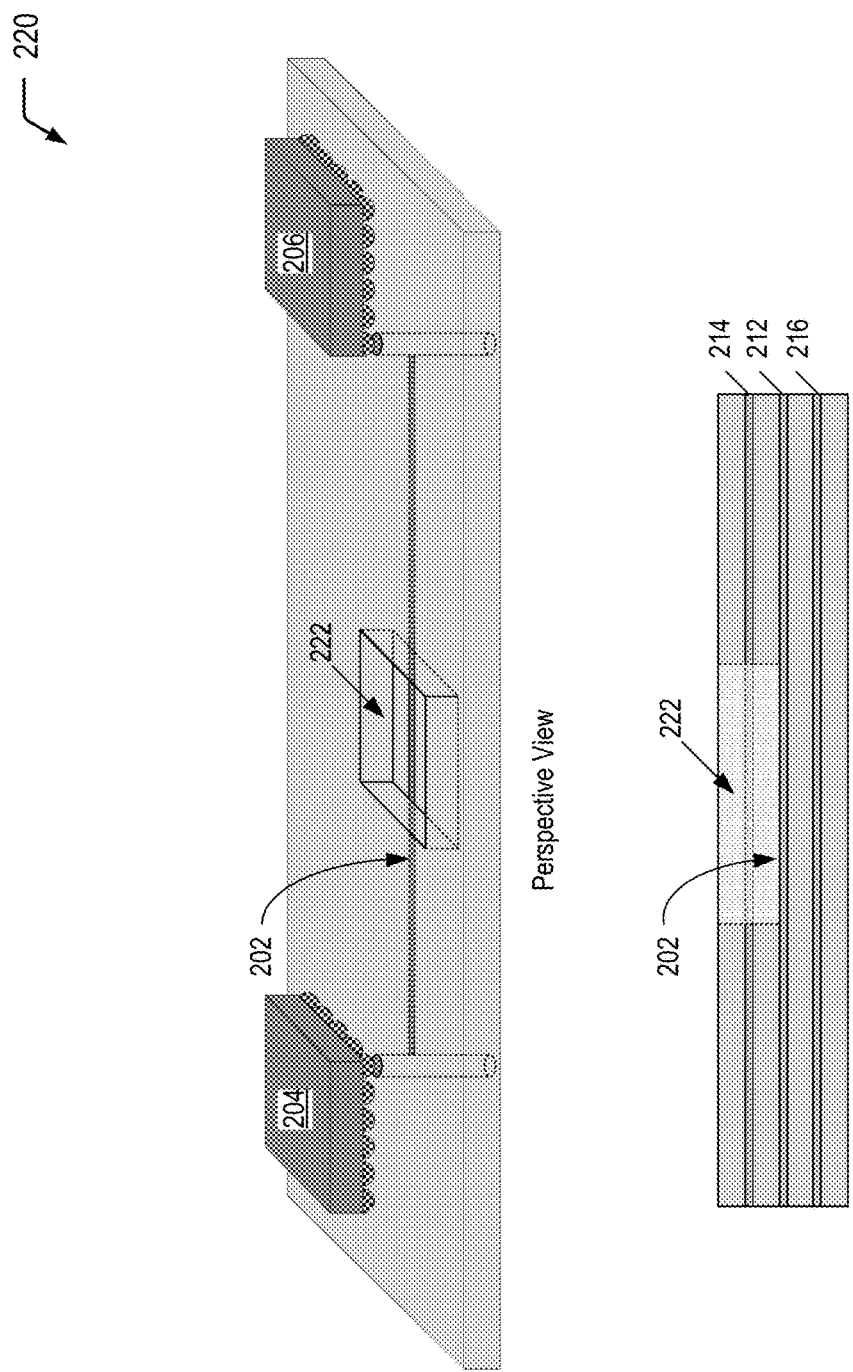
Figure 2C:
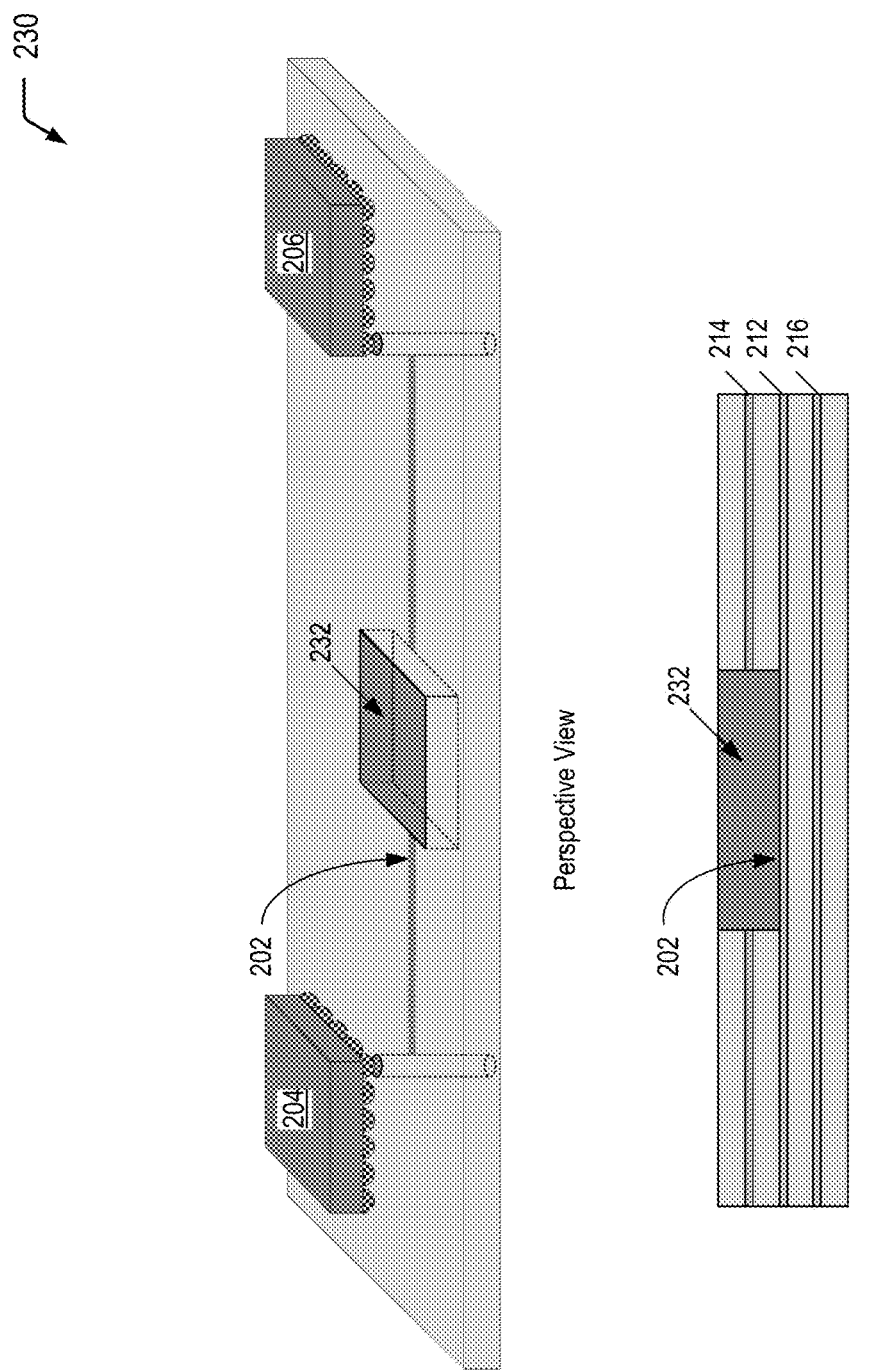

FIGS. 2A to 2C illustrate a process of selectively applying a sheet of dielectric material to a portion of a transmission line in an interface disposed on an internal layer of a PCB for evaluation of electrical properties of the interface, according to one embodiment.

Referring to FIG. 2A, a diagram 200 illustrates a portion of a PCB, in which a transmission line 202 electrically connects a first PCB component 204 and a second PCB component 206. The top portion of FIG. 2A corresponds to a perspective view of a portion of a PCB, and the bottom portion of FIG. 2A corresponds to a cross-sectional view of a selected portion of the PCB depicted in the top portion of FIG. 2A. The cross-sectional view illustrates that the PCB may include multiple internal layers. For illustrative purposes only, FIG. 2A depicts an example in which the internal layers include a first internal layer 212, a second internal layer 214, and a third internal layer 216. In the embodiment depicted in FIGS. 2A to 2C, the first internal layer 212 corresponds to a signal layer, and the transmission line 202 corresponds to a stripline. The second internal layer 214 and the third internal layer 216 correspond to ground planes.

FIG. 2B is a diagram 220 illustrating the formation of a cavity 222 in the PCB to expose a portion of the transmission line 202, and FIG. 2C is a diagram 230 illustrating application of a dielectric sheet 232 into the cavity 222.

Referring to FIG. 2C, the dielectric sheet 232 is used to change the electrical properties of the interface beneath the dielectric sheet 232. As illustrative, non-limiting examples, the dielectric sheet 232 may include a PTFE sheet, a graphite sheet, a silicone sheet, a sapphire sheet, or a polyimide sheet, with differing permittivity values. The dielectric sheet 232 enables a designer to affect the electrical properties of different interfaces beneath the dielectric sheet 232. This enables the designer to test the robustness of the interface to varying process parameters that may be encountered during full-scale production of the product. For example, the interface may include a high-speed serial interface or a memory interface, among other alternatives. The size and/or permittivity of the dielectric sheet 232 may vary, and the change in electrical properties may be used to perform margin testing on the interface.

To illustrate, a process of printed circuit board performance evaluation may include determining a first set of electrical properties associated with the interface between the first PCB component 204 and the second PCB component 206 prior to application of the dielectric sheet 232. Application of the dielectric sheet 232 (having a particular size/permittivity) results in a change in the electrical properties of the interface. As such, the process of printed circuit board performance evaluation may also include determining a second set of electrical properties associated with the interface after application of the dielectric sheet 232. The process of printed circuit board performance evaluation may further include performing margin testing by comparing the first set of electrical properties to the second set of electrical properties to evaluate printed circuit board performance.

Thus, FIGS. 2A to 2C illustrate an example of a printed circuit board performance evaluation technique that includes application of a dielectric sheet to a portion of a transmission line in an interface disposed on an internal layer of the printed circuit board. Application of the dielectric sheet results in a change in the electrical properties of the underlying interface, and the resulting change may be used to evaluate printed circuit board performance.

Figure 3:
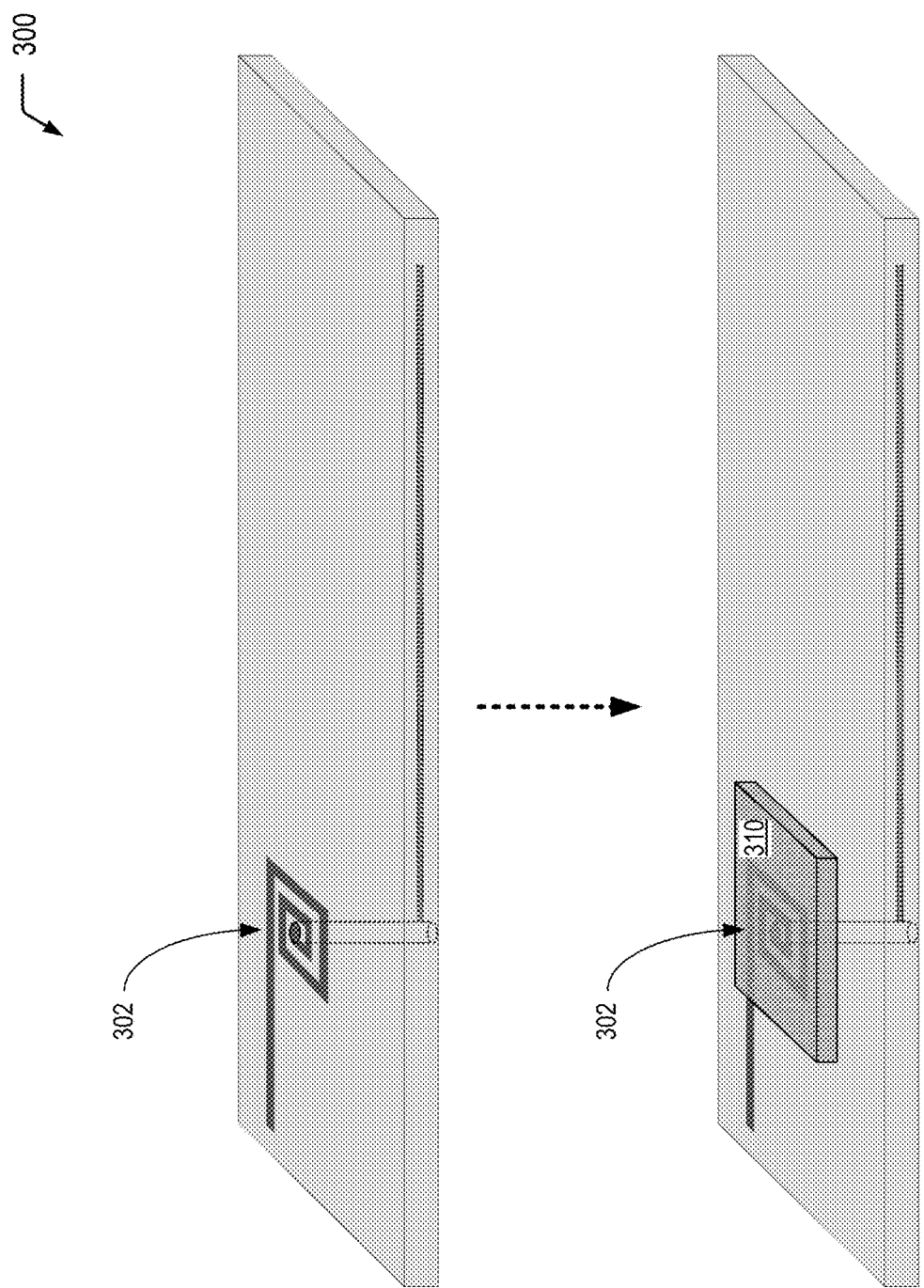
FIG. 3 is a diagram illustrating a process of applying a sheet of ferrous material to an interface that includes a trace inductor for evaluation of electrical properties of the interface, according to one embodiment.

Referring to FIG. 3, a particular embodiment of a printed circuit board performance evaluation technique is illustrated and generally designated 300. In FIG. 3, an interface of a PCB includes a trace inductor 302 (e.g., a spiral-shaped inductor). The top portion of FIG. 3 illustrates the trace inductor 302 prior to application of a ferrous sheet 310 (e.g., a sheet of ferrous material). The bottom portion of FIG. 3 illustrates that the ferrous sheet 310 overlies a portion of the trace inductor 302.

The ferrous sheet 310 (e.g., a ferrite sheet, among other possibilities for sheets of ferromagnetic material) is used to change the electrical properties of the interface beneath the ferrous sheet 310. The ferrous sheet 310 enables a designer to modify the trace inductance of the trace inductor 302 beneath the ferrous sheet 310. This enables the designer to test the robustness of the interface to varying process parameters that may be encountered during full-scale production of the product.

To illustrate, a process of printed circuit board performance evaluation may include determining a first set of electrical properties associated with the interface between a first PCB component (not shown) and a second PCB component (not shown) prior to application of the ferrous sheet 310. Application of the ferrous sheet 310 results in a change in the electrical properties of the interface (e.g., trace inductance). As such, the process of printed circuit board performance evaluation may also include determining a second set of electrical properties associated with the interface after application of the ferrous sheet 310. The process of printed circuit board performance evaluation may further include performing margin testing by comparing the first set of electrical properties to the second set of electrical properties to evaluate printed circuit board performance.

Thus, FIG. 3 illustrates an example of a printed circuit board performance evaluation technique that includes application of a sheet of ferrous material to a trace inductor in an interface of the printed circuit board. Application of the sheet of ferrous material results in a change in the electrical properties of the underlying interface, and the resulting change may be used to evaluate printed circuit board performance.

Figure 4:
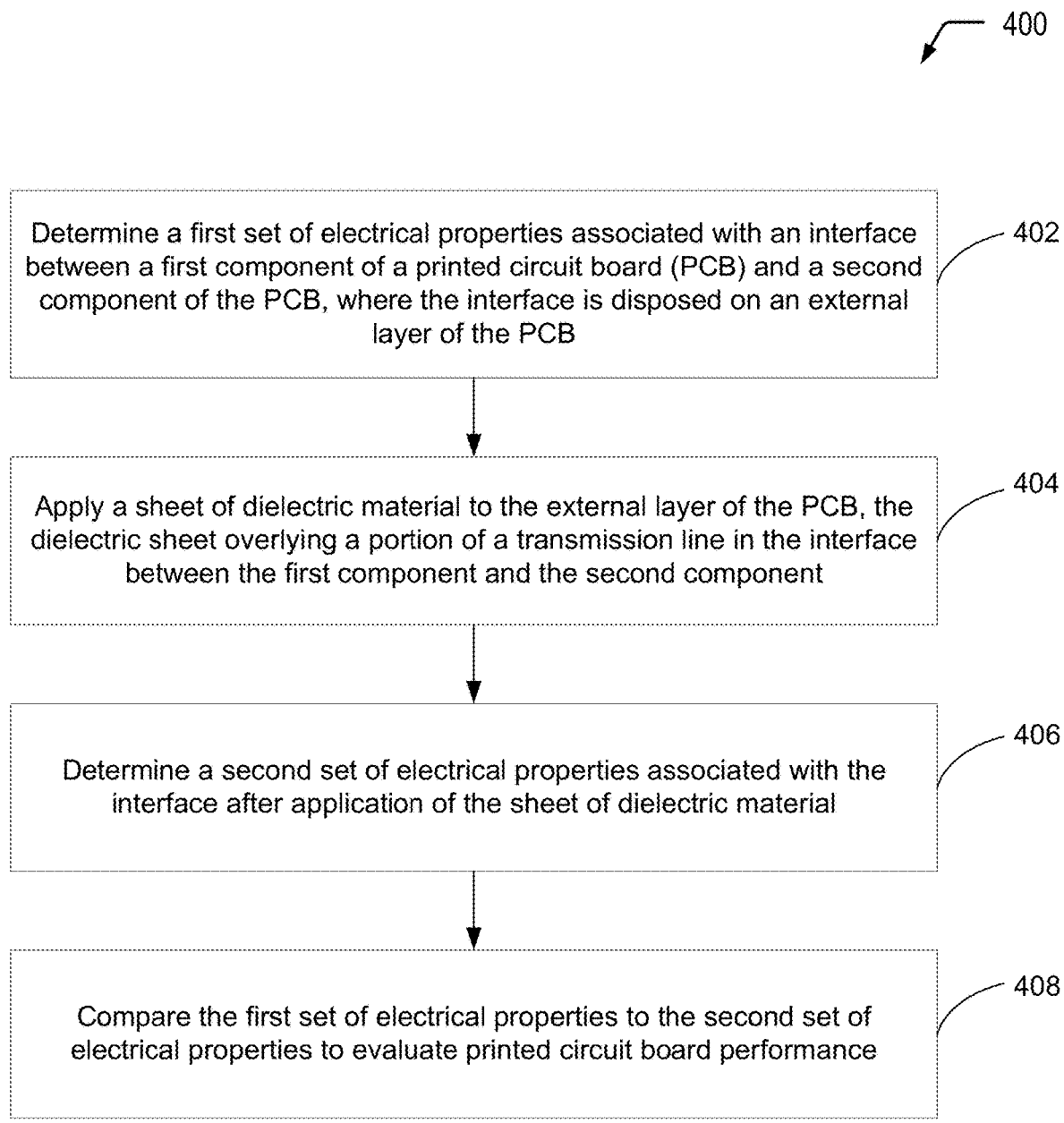
FIG. 4 is a flow diagram illustrating an example of a process of utilizing a dielectric sheet to evaluate electrical properties of an interface disposed on an external layer of a printed circuit board, according to one embodiment.

FIG. 4 is a flow diagram illustrating a process 400 of utilizing a dielectric sheet to evaluate electrical properties of an interface disposed on an external layer of a printed circuit board, according to one embodiment. Application of the dielectric sheet to the external layer of the printed circuit board in a change in the electrical properties of the underlying interface, and the resulting change may be used to evaluate printed circuit board performance.

The process 400 includes determining a first set of electrical properties associated with an interface between a first component of a PCB and a second component of the PCB, at 402. The interface is disposed on an external layer of the PCB. For example, referring to the top portion of FIG. 1, a first set of electrical properties associated with the interface between the first PCB component 104 and the second PCB component 106 may be determined prior to application of the dielectric sheet 110 (as depicted in the bottom portion of FIG. 1).

The process 400 includes applying a dielectric sheet to the external layer of the PCB, at 404. The dielectric sheet overlies a portion of a transmission line in the interface between the first component and the second component. For example, referring to the bottom portion of FIG. 1, the dielectric sheet 110 overlies a portion of the transmission line 102 in the interface between the first PCB component 104 and the second PCB component 106.

The process 400 includes determining a second set of electrical properties associated with the interface between the first component and the second component after application of the dielectric sheet, at 406. For example, referring to FIG. 1, the electrical properties associated with the interface between the first PCB component 104 and the second PCB component 106 may be determined after application of the dielectric sheet 110.

The process 400 further includes comparing the first set of electrical properties to the second set of electrical properties to evaluate printed circuit board performance, at 408. For example, referring to FIG. 1, PCB margin testing may include comparing the first set of electrical properties (corresponding to the top portion of FIG. 1) to the second set of electrical properties (corresponding to the bottom portion of FIG. 1).

Thus, FIG. 4 illustrates an example of a process of utilizing a dielectric sheet to evaluate electrical properties of an interface disposed on an external layer of a printed circuit board. Application of the dielectric sheet to the external layer of the printed circuit board results in a change in the electrical properties of the underlying interface, and the resulting change may be used to evaluate printed circuit board performance.

Figure 5:
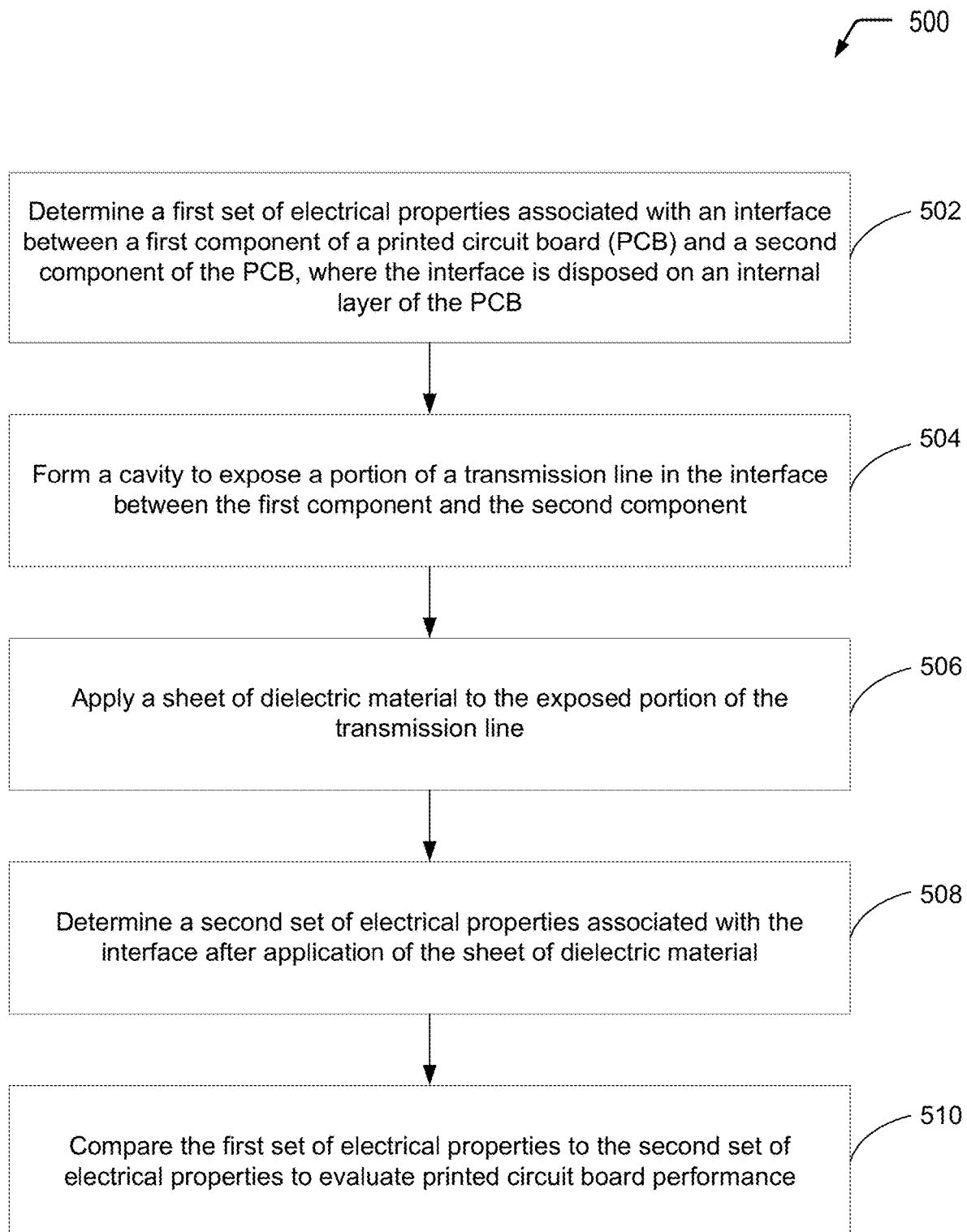
FIG. 5 is a flow diagram illustrating an example of a process of utilizing a dielectric sheet to evaluate electrical properties of an interface disposed on an internal layer of a printed circuit board, according to one embodiment.

FIG. 5 is a flow diagram illustrating a process 500 of utilizing a dielectric sheet to evaluate electrical properties of an interface disposed on an internal layer of a printed circuit board, according to one embodiment.

The process 500 includes determining a first set of electrical properties associated with an interface between a first component of a PCB and a second component of the PCB, at 502. The interface is disposed on an internal layer of the PCB. For example, referring to FIG. 2A, a first set of electrical properties associated with the interface between the first PCB component 204 and the second PCB component 206 may be determined prior to cavity formation (as depicted in FIG. 2B).

The process 500 includes forming a cavity to expose a portion of a transmission line disposed on the internal layer of the PCB, at 504. For example, referring to FIG. 2B, formation of the cavity 222 results in exposure of a portion of the transmission line 202 disposed on the first internal layer 212.

The process 500 includes applying a sheet of dielectric material to the exposed portion of the transmission line, at 506. For example, referring to FIG. 2C, the dielectric sheet 232 may be applied to the exposed portion of the transmission line 202 (as depicted in FIG. 2B). The process 500 also includes determining a second set of electrical properties associated with the interface between the first component and the second component after application of the dielectric sheet, at 508. For example, referring to FIG. 2C, the electrical properties associated with the interface between the first PCB component 204 and the second PCB component 206 may be determined after application of the dielectric sheet 210.

The process 500 further includes comparing the first set of electrical properties to the second set of electrical properties to evaluate printed circuit board performance, at 510. For example, PCB margin testing may include comparing the first set of electrical properties (corresponding to FIG. 2A) to the second set of electrical properties (corresponding to FIG. 2C).

Thus, FIG. 5 illustrates utilizing a dielectric sheet to evaluate electrical properties of an interface disposed on an internal layer of a printed circuit board. Application of the dielectric sheet to the internal layer of the printed circuit board results in a change in the electrical properties of the underlying interface, and the resulting change may be used to evaluate printed circuit board performance.

Figure 6:
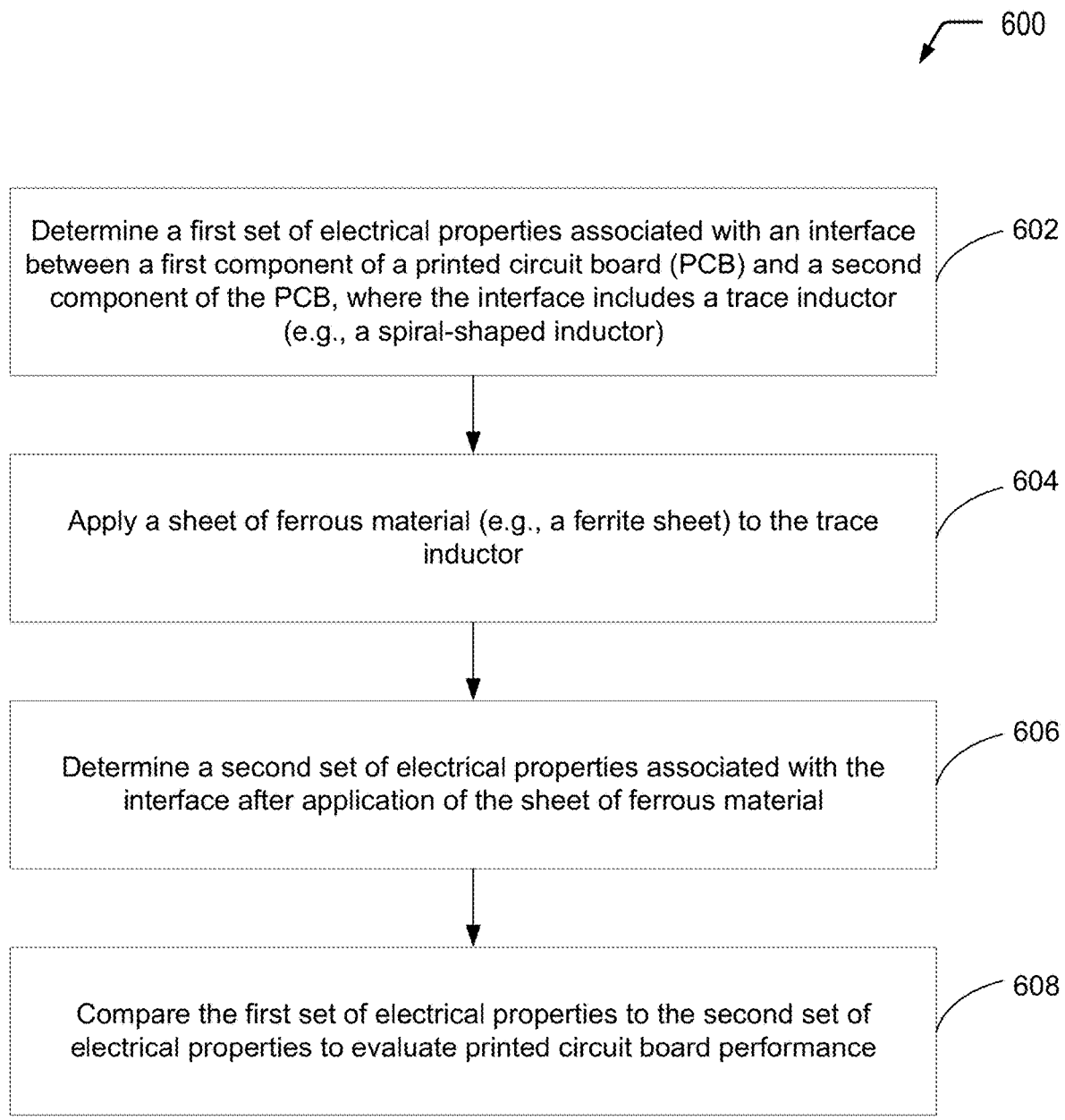
FIG. 6 is a flow diagram illustrating an example of a process of utilizing a sheet of ferrous material to evaluate electrical properties of an interface of a printed circuit board that includes a trace inductor, according to one embodiment.

FIG. 6 is a flow diagram illustrating a process 600 of utilizing a sheet of ferrous material to evaluate electrical properties of an interface of a printed circuit board that includes a trace inductor, according to one embodiment.

The process 600 includes determining electrical properties associated with an interface between a first component of a PCB and a second component of the PCB, at 602. The interface includes a trace inductor, such as a spiral-shaped inductor. For example, referring to FIG. 3, the interface between components (not shown in FIG. 3) includes the trace inductor 302.

The process 600 includes applying a sheet of ferrous material to the trace inductor, at 604. For example, the bottom portion of FIG. 3 illustrates the application of the ferrous sheet 310 to the trace inductor 302. The process 600 also includes determining electrical properties associated with the interface after application of the sheet of ferrous material, at 606. For example, referring to FIG. 3, the electrical properties associated with the interface may be determined after application of the ferrous sheet 310 (as depicted in the bottom portion of FIG. 3).

The process 600 further includes comparing the first set of electrical properties to the second set of electrical properties to evaluate printed circuit board performance, at 608. For example, referring to FIG. 3, PCB margin testing may include comparing the first set of electrical properties (corresponding to the top portion of FIG. 3) to the second set of electrical properties (corresponding to the bottom portion of FIG. 3).

Thus, FIG. 6 illustrates an example of a process of utilizing a sheet of ferrous material to evaluate electrical properties of an interface of a printed circuit board that includes a trace inductor. Application of the sheet of ferrous material to the trace inductor results in a change in the electrical properties of the underlying interface, and the resulting change may be used to evaluate printed circuit board performance.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A process of printed circuit board performance evaluation, the process comprising:
   determining a first set of electrical properties associated with an interface between a first component of a printed circuit board (PCB) and a second component of the PCB, wherein the interface and the first and second components are disposed on a single external layer of the PCB;
   applying a sheet of dielectric material to the external layer of the PCB, wherein the sheet of dielectric material is applied to, and overlies, a portion of a microstrip trace in the interface;
   determining a second set of electrical properties associated with the interface after application of the sheet of dielectric material; and
   comparing the first set of electrical properties to the second set of electrical properties to evaluate printed circuit board performance.

2. The process of claim 1, wherein the interface includes a high-speed serial interface.

3. The process of claim 1, wherein the interface includes a memory interface.

4. The process of claim 1, wherein the sheet of dielectric material has a size and a permittivity selected to emulate a particular set of PCB manufacturing process parameters within a range of PCB manufacturing process parameters.

5. The process of claim 1, wherein the external layer includes a solder mask that overlies the interface.

6. The process of claim 1, wherein the microstrip trace connects between the first component and the second component.

7. The process of claim 1, wherein the sheet of dielectric material includes a polytetrafluoroethylene (PTFE) sheet, a graphite sheet, a silicone sheet, a sapphire sheet, or a polyimide sheet.

* * * * *